United States Patent [19]

Nagase

[11] Patent Number: 5,220,298
[45] Date of Patent: Jun. 15, 1993

[54] INTEGRATED CIRCUIT HAVING A BUILT-IN NOISE FILTER

[75] Inventor: Masashi Nagase, Yokohama, Japan

[73] Assignee: Kabushiki Kaisha Toshiba, Kawasaki, Japan

[21] Appl. No.: 734,733

[22] Filed: Jul. 23, 1991

[30] Foreign Application Priority Data

Jul. 24, 1990 [JP] Japan ................................. 2-194076

[51] Int. Cl.⁵ ............................................. H03H 7/00
[52] U.S. Cl. ..................... 333/185; 333/182; 361/392
[58] Field of Search ............ 333/167, 168, 214, 28 R, 333/12, 181, 185; 361/392, 399; 174/52.1, 52.5; 439/607, 608, 620

[56] References Cited

U.S. PATENT DOCUMENTS 5,012,201 4/1991 Morita et al. .................... 333/214 X

FOREIGN PATENT DOCUMENTS 0131112 6/1991 Japan .
0159303 7/1991 Japan .

Primary Examiner—Robert J. Pascal
Assistant Examiner—Ali Neyzari
Attorney, Agent, or Firm—Finnegan, Henderson, Farabow, Garrett & Dunner

[57] ABSTRACT

A semiconductor integrated circuit comprising a semiconductor chip provided within a package, inner leads connected to the semiconductor chip, and a high-frequency noise filter connected to the inner leads. The semiconductor chip includes a high-frequency circuit. Thereby, this semiconductor integrated circuit prevents an around circuit from being damaged by high-frequency noise generated from the high-frequency circuit, without installing the noise filter around the semiconductor integrated circuit.

16 Claims, 7 Drawing Sheets

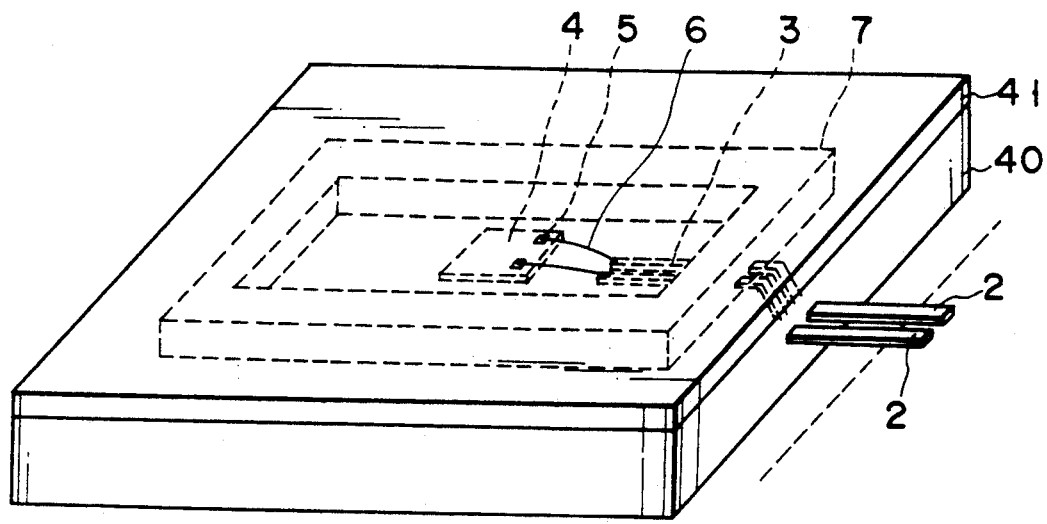
F I G. 4
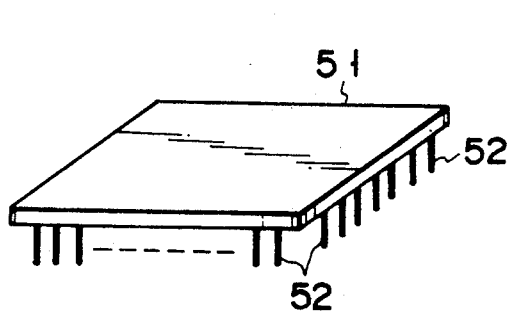
F I G. 5A
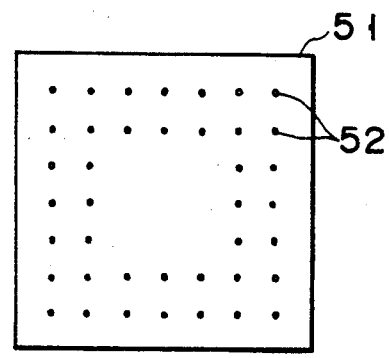
F I G. 5B
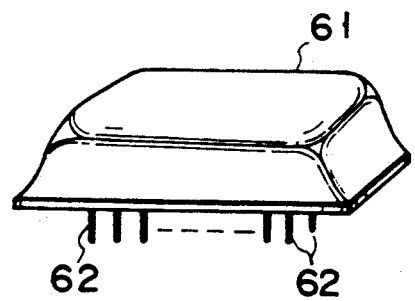
F I G. 6

INTEGRATED CIRCUIT HAVING A BUILT-IN NOISE FILTER

BACKGROUND OF THE INVENTION

1. Field of the Invention

The present invention relates generally to a semiconductor integrated circuit device, and more particularly to a semiconductor integrated circuit device wherein a high-frequency noise filter is provided within a package (an outer casing) and outside an integrated circuit chip.

2. Description of the Related Art

In a conventional large-scale integrated (LSI) circuit device in which a high-frequency circuit is built, special high-frequency noise preventing means is not provided within a package and outside a semiconductor pellet. Thus, high-frequency noise leaks from the integrated circuit device (IC device), and the IC device may malfunction owing to the high-frequency radiation noise. In addition, another IC connected to the IC device or a separate IC may malfunction. If the radiation noise from the IC device is large, a system (e.g. a word processor, a personal computer, etc.) using this IC device fails to meet the requirement under the Electro-Magnetic Interference (EMI) Regulations.

SUMMARY OF THE INVENTION

The object of the present invention is to provide a semiconductor integrated circuit capable of reducing high frequency radiation noise from a built-in high-frequency circuit in the integrated circuit and its peripheral integrated circuit, and preventing the integrated circuit or its peripheral circuit from malfunctioning.

According to this invention, there is provided a semiconductor integrated circuit comprising a semiconductor chip provided within a package, inner leads connected to the semiconductor chip, and a high-frequency noise filter connected to the inner leads.

According to the above structure, the noise filter connected to the inner leads within the package can reduce high-frequency radiation noise from a built-in high-frequency circuit in the integrated circuit and its peripheral circuit, without providing a noise filter near the integrated circuit, and can prevent the integrated circuit or its peripheral circuit from malfunctioning, thereby realizing circuit miniaturization, simplification of fabrication process, and cost reduction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a perspective view showing a plastic flat package type semiconductor integrated circuit device according to a second embodiment of the present invention;

FIG. 5A is a perspective view showing a pin-grid array type semiconductor integrated circuit device according to a third embodiment of the present invention;

FIG. 5B is a plan view showing the arrangement of lead terminals on the rear face of the semiconductor integrated circuit shown in FIG. 5A;

FIG. 6 is a perspective view showing a metal-type pin-grid array semiconductor integrated circuit device according to a fourth embodiment of the present invention;

DETAILED DESCRIPTION OF THE PREFERRED EMBODIMENTS

Embodiments of the present invention will now be described with reference to the accompanying drawings.

Figure 1A:
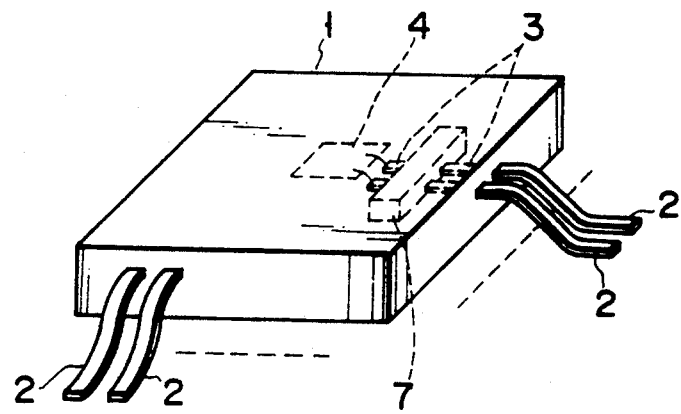
FIG. 1A is a partially see-through perspective view showing a plastic flat package type semiconductor integrated circuit device according to a first embodiment of the present invention.
Figure 1B:
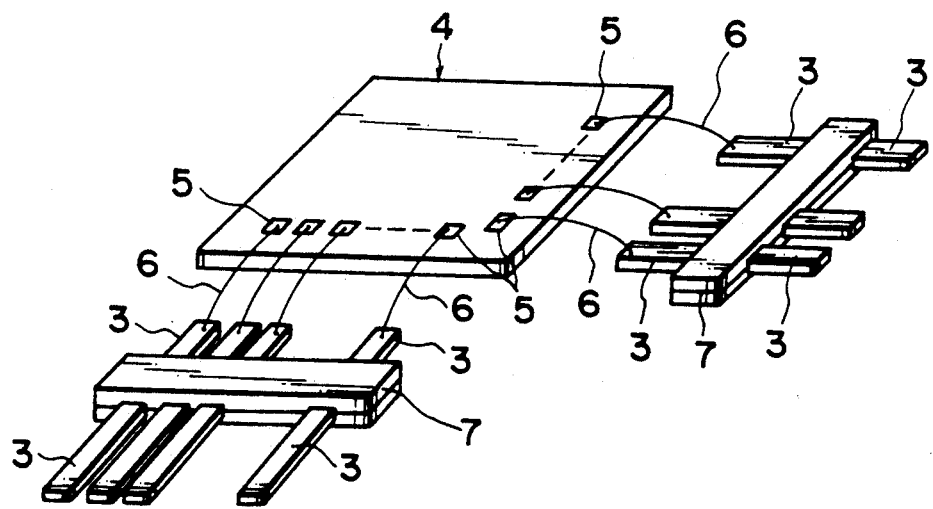
FIG. 1B is a perspective view showing part of the inside of the package of the semiconductor integrated circuit device shown in FIG. 1A.

FIG. 1A is a partially see-through view showing an LSI having a built-in high-frequency circuit according to a first embodiment of the present invention, and FIG. 1B shows part of the inside of a package. Reference numeral 1 denotes a plastic flat package, 2 outer leads, 3 inner leads, 4 a large-scale integrated circuit chip (LSI chip) in which a high-frequency circuit is formed, 5 bonding pads on the chip, 6 bonding wires for electrically connecting the inner leads 3 and the pads 5, and 7 high-frequency noise filters provided, for example, for all inner leads 3. In this embodiment, each of the high-frequency noise filters is provided for a specified number of inner leads.

Figure 2:
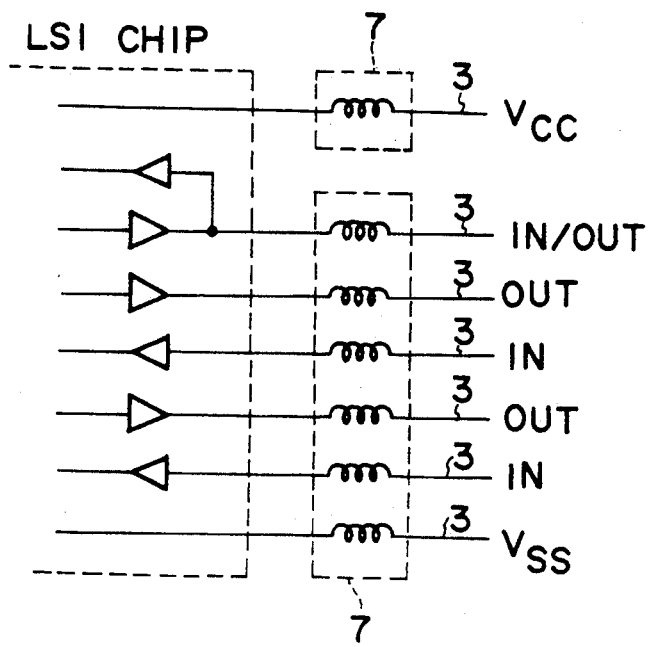
FIG. 2 is a circuit diagram showing an equivalent circuit of a high-frequency noise filter shown in FIG. 1.

The high-frequency noise filter 7 is made of a high magnetic substance for high frequencies, for example, a plate-like or cylindrical ferrite core, through which inner leads 3 are passed. In this case, the inner leads 3 may be sandwiched by vertically divided two high magnetic bodies. Thus, as in an equivalent circuit shown in FIG. 2, high-frequency choke coils are inserted in the inner leads 3, thereby reducing high-frequency noise transmitted through a Vcc power source terminal, a ground potential (Vss) terminal, an input terminal, an output terminal, and inner leads 3 for input/output terminals.

Figure 3:
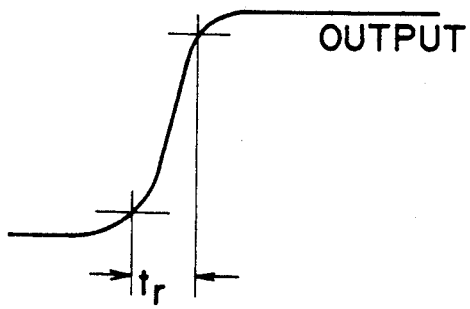
FIG. 3 is a chart for illustrating the rising time and falling time of the output waveform and the input waveform at inner leads shown in FIG. 1.
Figure 3:
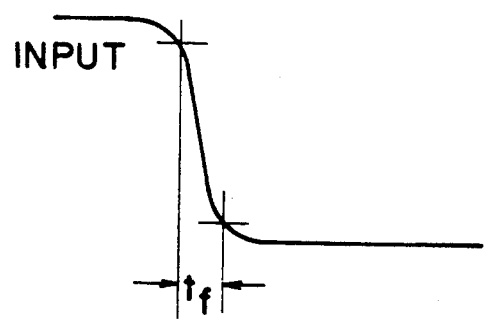

FIG. 3 shows a case where a rising time tr and a falling time tf of an output waveform output from inner leads 3 for output terminals and from inner leads 3 for input/output terminals or an input waveform input from inner leads 3 for input terminals and from inner leads 3 for input/output terminals are too short. In this case, cross-talk noise occurs in adjacent signals lines, resulting in malfunction. In addition, there may occur a malfunction due to a fluctuation in potential of a ground potential line at the time output waveforms appear simultaneously at the inner leads 3 for output terminals. These malfunctions can be prevented, for example, by optimizing the constant of the high-frequency noise filter 7 and thereby adjusting the rising time tr and the falling time tf.

According to the LSI of the first embodiment, the high-frequency noise filter 7 is provided within the package and outside the integrated circuit (IC) chip, in the case where the high-frequency circuit is built in the LSI. Thus, high-frequency radiation noise can be reduced, it is possible to prevent malfunctions of the IC itself or another IC connected to the IC or a separately provided IC. Accordingly, a system using the IC can easily meet the requirement under the EMI regulations.

FIG. 4 is a partially see-through view showing an LSI having a built-in high-frequency circuit, according to a second embodiment of the invention. Reference numeral 40 denotes a base portion of a ceramic flat package, 41 a cover portion of the ceramic flat package, 2 outer leads, 3 inner leads, 4 an IC chip in which a high-frequency circuit is formed, 5 bonding pads on the chip, 6 bonding wires for electrically connecting the pads 5 and the inner leads 3, and 7 a high-frequency noise filter provided, for example, for all inner leads 3. In this embodiment, the high-frequency noise filter 7 is integrated.

The high-frequency noise filter 7 is made of a plate like or cylindrical high magnetic substance, through which inner leads 3 are passed. In this case, the inner leads 3 may be sandwiched by vertically divided two high magnetic bodies.

In each of the above embodiments, the high-frequency noise filter 7 is provided for all inner leads 3. If it is not necessary to provide the filter 7 for all inner leads, the filter 7 may be provided for only some of the inner leads 3. For example, the high-frequency noise filter 7 may be provided for only the inner leads 3 for power source terminal or the inner leads 3 for ground terminal.

Any type of high-frequency noise filter 7 may be employed, if it can reduce high-frequency noise. Depending on the required degree of effect, any type of filter (including a through-type capacitor). In the case of a ring core, ferrite is mainly used as material, but other material may be used. A capacitor element may be used on an as-needed basis. The feature of the present invention is that the high-frequency noise filter 7 is provided within the package and outside the IC chip. This invention is applicable to various types of packages.

For example, when high-frequency noise is let out directly through the package and not through the inner leads 3, there are the following methods in order to prevent the noise. The package itself is made of an electrically conductive material (of course, it is necessary to insulate the package from the inner element or leads). Alternatively, the package is formed of an insulating material, and the surface of the package is coated with an electrically conductive material or with an electromagnetic wave absorbing material (e.g. ferrite powder). Thus, high-frequency radiation noise can be reduced. Besides, the high-frequency noise can be further reduced by electrically connecting the package of the electrically conductive material or the electrically conductive surface or electromagnetic wave absorbing material of the insulative package to a low-impedance Vcc power source terminal or a ground terminal.

Figure 11:
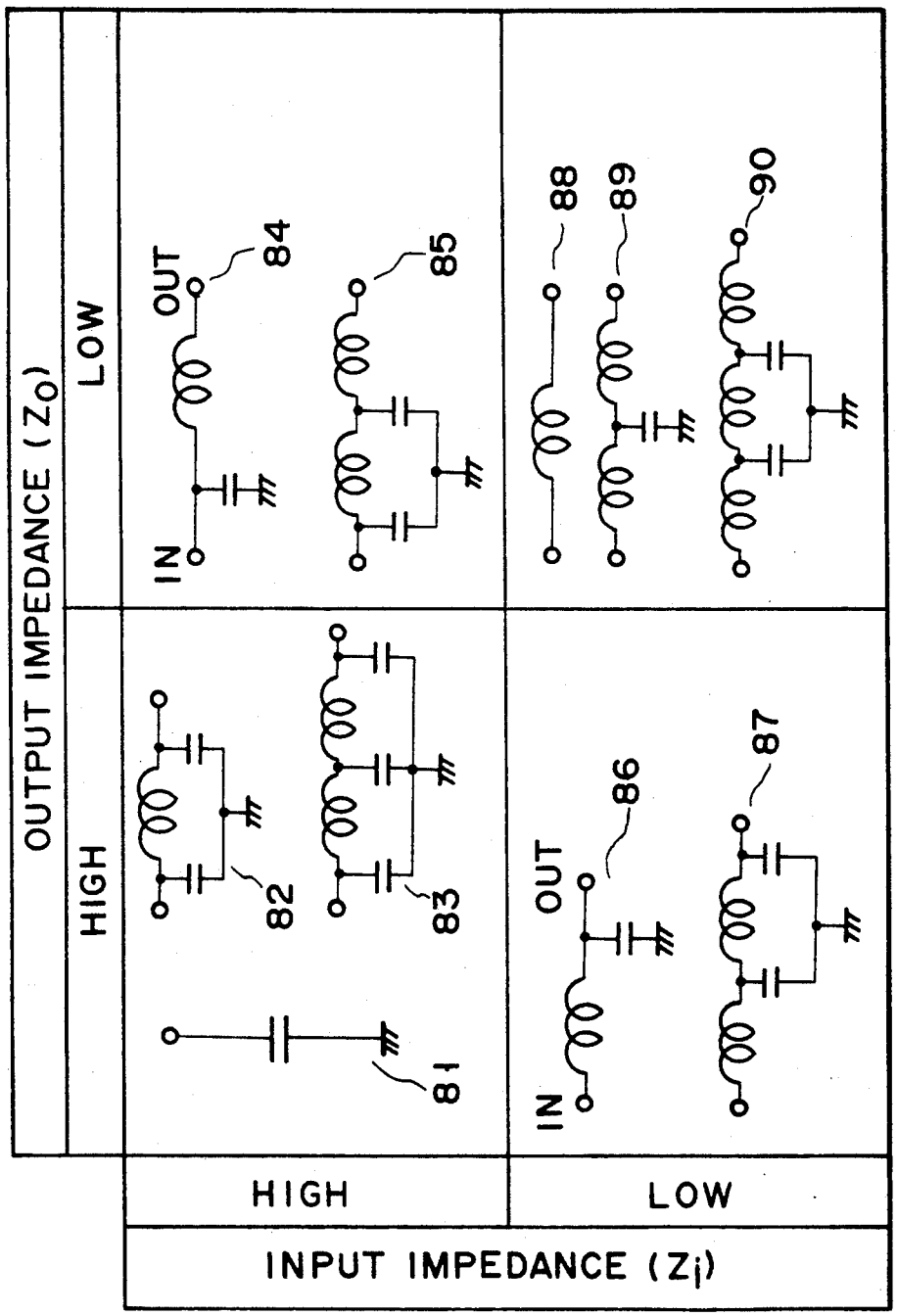
FIG. 11 shows other embodiments of the noise filter according to the invention.

FIG. 11 shows other embodiments of the noise filter according to the present invention. FIG. 11 shows some examples of the filter circuit used in a general input/output circuit, and all these filter circuits may be selectively employed as a built-in filter of the present invention. In FIG. 11, various circuit modes may be considered in a general input/output circuit, in accordance with the magnitude of input impedance and output impedance. Reference numeral 81 denotes a capacitor type; 82 a $\pi$-type with two capacitors; 83 a double $\pi$-type; 84 an L-type; 85 a double L-type; 86 an L-type; 87 a double L-type; 88 a coil type; 89 a T-type; and 90 a double T-type.

As seen from these embodiments, in accordance with the requirements, a suitable filter comprising the capacitor(s) and coil(s) based on the respective modes is provided in the inner leads. Thus, an optimal filter matching with the magnitude of the input/output impedance can be realized.

FIG. 5A shows a ceramic type pin-grid array (PGA) LSI according to a third embodiment of the present invention, wherein a high-frequency circuit is formed. FIG. 5B shows the arrangement of lead pins 52 on the rear face of the LSI. Similarly with the second embodiment, a high-frequency noise filter (not shown) can be provided. Reference numeral 51 denotes a ceramic package. The base portion for fixing and supporting the inner leads (not shown) of the package 51 may be constituted by, for example, a high-frequency noise filter made of a magnetic substance.

FIG. 6 shows a metal-type pin-grid array LSI according to a fourth embodiment of the invention, wherein a high-frequency circuit is formed. In this embodiment, too, it is possible to provide a high-frequency noise filter (not shown), as in the second embodiment. Reference numeral 61 denotes a cover portion of a metal package, and 62 lead pins. The base portion for fixing and supporting the inner leads (not shown) of the metal package may be constituted by, for example, a high-frequency noise filter made of a magnetic substance.

Figure 7:
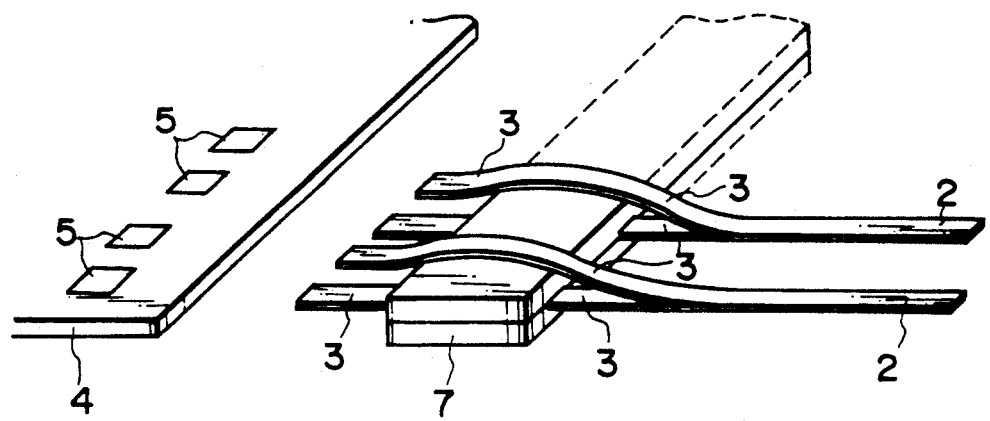
FIG. 7 and FIG. 8 show the mount states of the high-frequency noise filters in semiconductor integrated circuit devices according to other embodiments, wherein each outer lead is branched into two inner leads.
Figure 8:
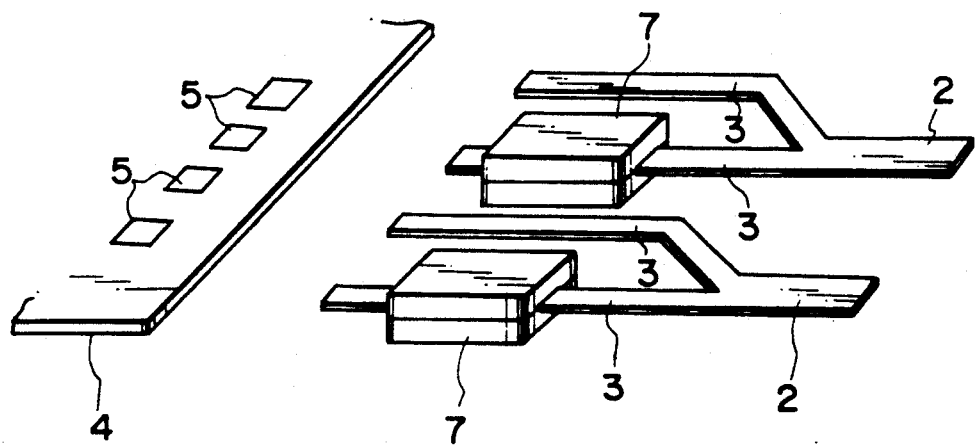

In each of the above embodiments, one outer lead 2 corresponds to one inner lead 3. However, FIGS. 7 and 8 show LSIs according to other embodiments of the invention, wherein one outer lead 2 is branched into two inner leads 3. (In fact, one outer lead is divided into two inner leads by means of press molding, or a separate inner lead is welded to an inner lead integrated with one outer lead.) In this case, only one of the two inner leads 2 is integrally (FIG. 7) or individually (FIG. 8) provided with the high-frequency noise filter 7. In addition, a given one of the two inner leads 3 may be bonded to select a line or a bypass of the high-frequency noise filter.

Figure 9:
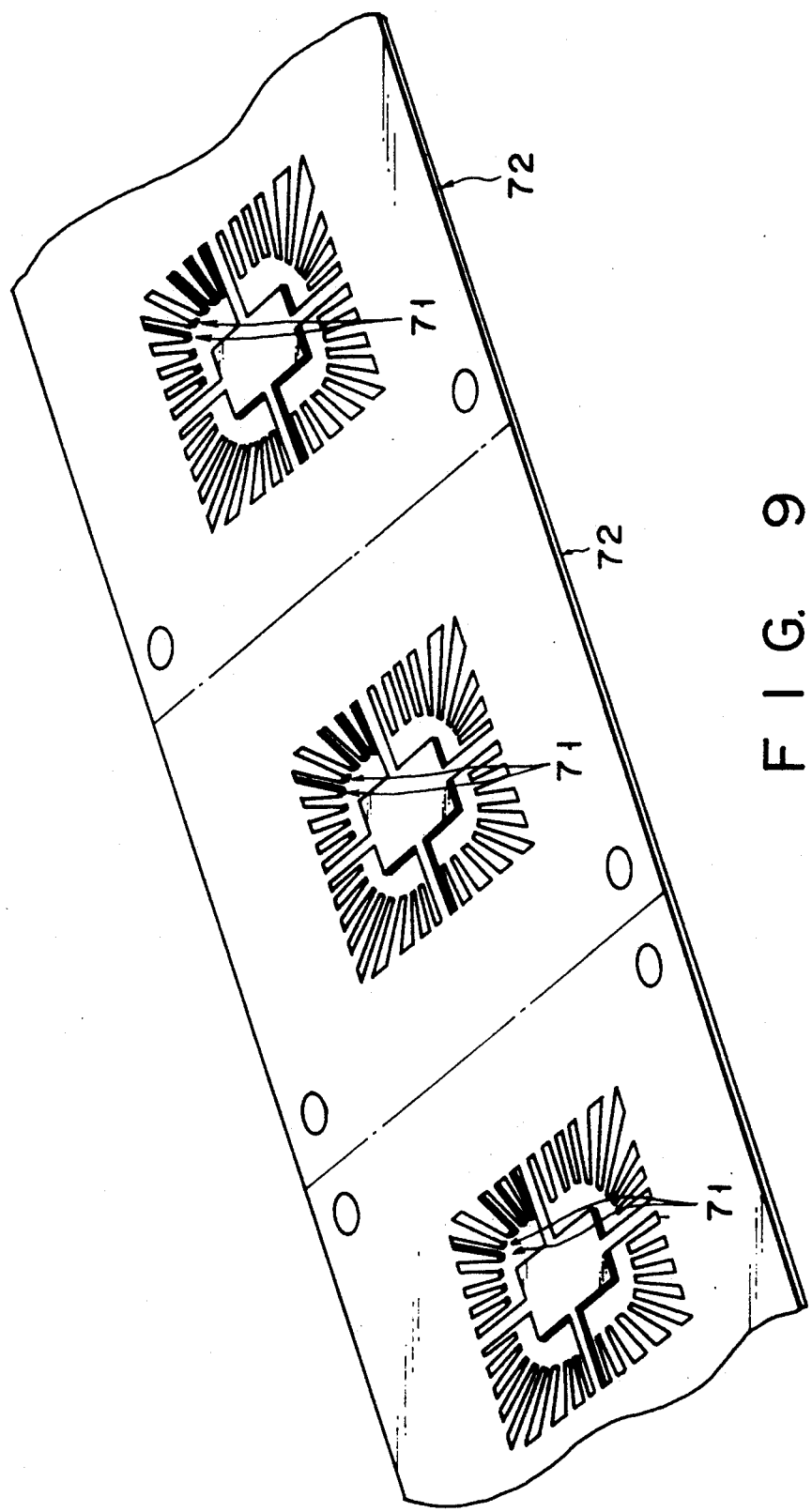
FIG. 9 shows a lead frame of a semiconductor semiconductor circuit in which the noise filter according to this invention is connected.
Figure 10:
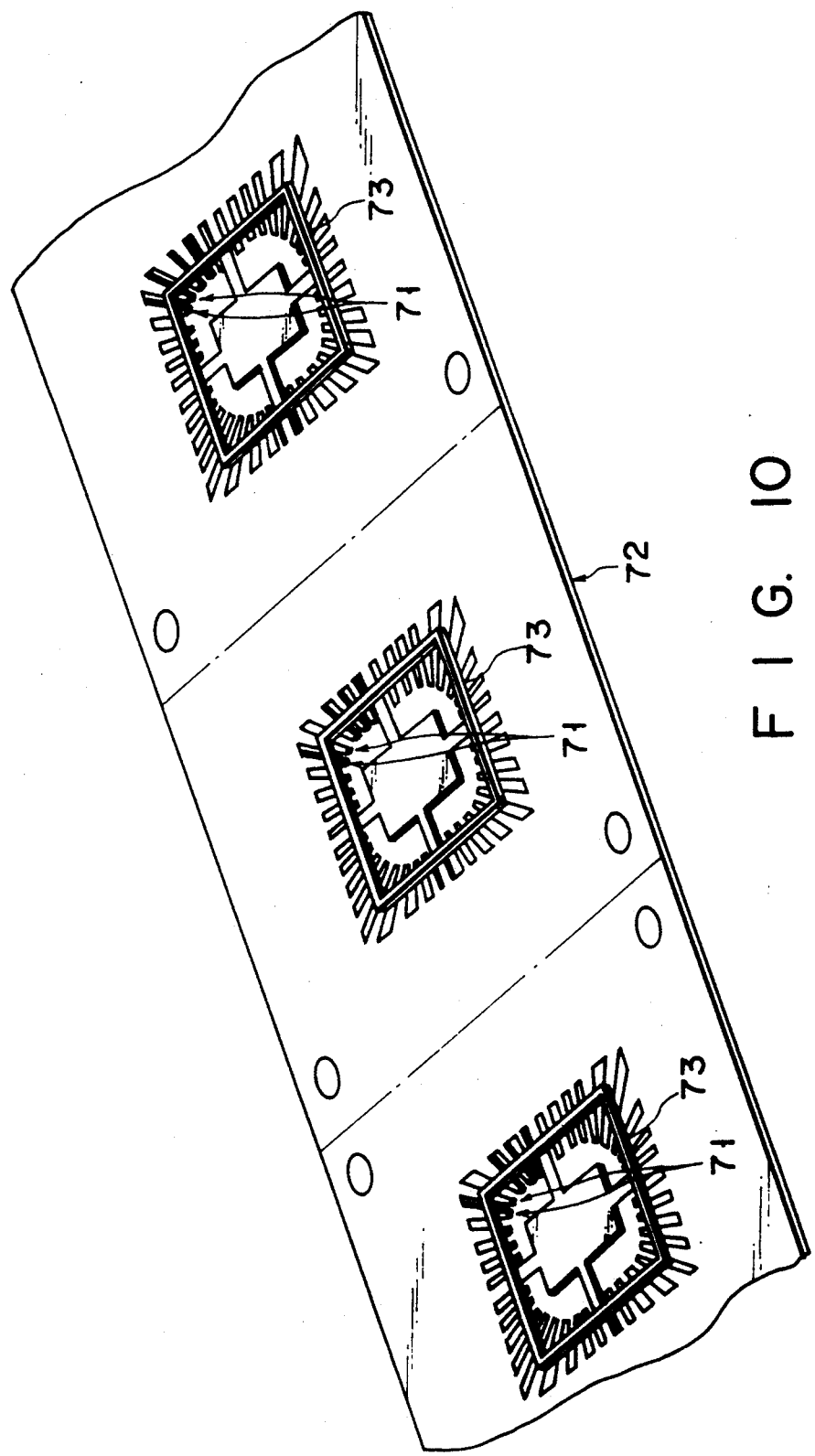
FIG. 10 shows the state in which the noise filter according to this invention is connected to the lead frame.

FIG. 9 shows a lead frame of a semiconductor IC to which the noise filter of this invention is connected. FIG. 10 shows the state in which the noise filter of this invention is connected to the lead frame.

In FIG. 9, reference numeral 71 denotes inner leads, and 72 a lead frame. FIG. 9 shows the state in which a semiconductor chip 4 has not yet been mounted. In FIG. 10, ferrite plates 73 for the noise filter are coupled to the upper and lower faces of the inner leads 71 of the frame 72 shown in FIG. 9. In FIG. 10, the lower ferrite plate 73 is not shown, but the same ferrite plate as that coupled to the upper surface of the inner lead is provided on the lower surface thereof.

FIGS. 9 and 10 illustrate the method of mounting the filter on the inner leads. Specifically, the inner leads 71 of the lead frame 72 are provided before the semiconductor chip 4 is mounted. According to this method, it is not necessary to pay particular attention to the silicon chip 4 and bonding wire 6, which are easily damaged, when the filter is mounted. Thus, the filter can be easily mounted.

As has been described above, according to the semiconductor IC device of the present invention, even when a high-frequency circuit is built in the IC, high-frequency radiation noise can be reduced, and it is possible to prevent malfunctions of the IC itself or another IC connected to this IC or a separate IC. Thus, a system using this IC can easily meet the requirement under the EMI regulations. In addition, it is possible to normally operate a very high speed IC device which may respond with high sensitivity to high-frequency radiation noise from the IC device or external low noise, resulting in malfunctions.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
    an integrated circuit package;
    a semiconductor chip provided within said package;
    inner leads connected to said semiconductor chip and extending from the chip through the package; and
    means for preventing said inner leads from transmitting noise of a predetermined frequency, said means being connected to the inner leads within the package and being independent of circuitry within the chip.

2. A semiconductor integrated circuit according to claim 1, wherein said semiconductor chip includes a high-frequency circuit.

3. A semiconductor integrated circuit according to claim 1, wherein said predetermined frequency is high frequency.

4. A semiconductor integrated circuit according to claim 1, wherein said preventing means has a plurality of divided forms.

5. A semiconductor integrated circuit according to claim 1, wherein said preventing means consists of two parts, and said inner leads are sandwiched by the two parts of the preventing means vertically.

6. A semiconductor integrated circuit according to claim 1, wherein a plurality of said preventing means are provided, and each of said means is connected to only some of said inner leads and not to the other inner leads.

7. A semiconductor integrated circuit according to claim 1, wherein said preventing means includes a ferrite core.

8. A semiconductor integrated circuit according to claim 1, wherein said preventing means includes a capacitor.

9. A semiconductor integrated circuit according to claim 1, wherein said package includes an electrically conductive material.

10. A semiconductor integrated circuit according to claim 1, wherein said package includes an insulating material, and the surface of the package includes an electrically conductive material.

11. A semiconductor integrated circuit according to claim 1, wherein said package includes an insulating material, and the surface of the package includes an electromagnetic wave absorbing material.

12. A semiconductor integrated circuit according to claim 11, wherein said electromagnetic wave absorbing material is connected to circuit ground.

13. A semiconductor integrated circuit according to claim 1, wherein a plurality of said inner leads are provided, and some of the inner leads are not connected to said preventing means and are branched.

14. A method of manufacturing a semiconductor integrated circuit, comprising:
    a first step of connecting preventing means to a frame for said semiconductor integrated circuit, said preventing means preventing inner leads of said frame from transmitting noise of a predetermined frequency;
    a second step of mounting a semiconductor chip at a center portion of said frame, following the first step; and
    a third step of connecting the inner leads of the frame to bonding pads of the semiconductor chip by means of wires, following the second step.

15. A method according to claim 14, wherein said semiconductor chip includes a high-frequency circuit.

16. A method according to claim 14, wherein said preventing means is divided into a plurality of parts.

* * * * *